(12) United States Patent

Briere (10) Patent No.: US 9,343,562 B2
(45) Date of Patent: May 17, 2016

(54) DUAL-GATED GROUP III-V MERGED TRANSISTOR

(71) Applicant: International Rectifier Corporation, El Segundo, CA (US)

(72) Inventor: Michael A. Briere, Scottsdale, AZ (US)

(73) Assignee: Infineon Technologies Americas Corp., El Segundo, CA (US)

(*) Notice: Subject to any disclaimer, the term of this patent is extended or adjusted under 35 U.S.C. 154(b) by 0 days.

(21) Appl. No.: 14/539,885

(22) Filed: Nov. 12, 2014

(65) Prior Publication Data

US 2015/0162424 A1  Jun. 11, 2015

Related U.S. Application Data

(60) Provisional application No. 61/913,156, filed on Dec. 6, 2013.

(51) Int. Cl.
| | |
|---|---|
| *H01L 29/778* | (2006.01) |
| *H01L 29/423* | (2006.01) |
| *H01L 29/78* | (2006.01) |
| *H01L 29/20* | (2006.01) |

(52) U.S. Cl.
CPC ........ *H01L 29/778* (2013.01); *H01L 29/42316* (2013.01); *H01L 29/7786* (2013.01); *H01L 29/2003* (2013.01); *H01L 29/4236* (2013.01); *H01L 29/7831* (2013.01); *H01L 29/7832* (2013.01)

(58) Field of Classification Search
CPC ............ H01L 29/778; H01L 29/42316; H01L 29/7786; H01L 29/4236; H01L 29/2003; H01L 29/7831; H01L 29/7832; H01L 29/7787; H01L 29/402

USPC .................. 257/194, 195, 196, 76, 183, 189, 257/E29.246, E27.061; 438/48, 285, 60
See application file for complete search history.

(56) References Cited

U.S. PATENT DOCUMENTS

| | | |
|---|---|---|
| 6,617,060 B2 | 9/2003 | Weeks |
| 6,649,287 B2 | 11/2003 | Weeks |
| 7,339,205 B2 | 3/2008 | Piner |
| 8,264,003 B2 | 9/2012 | Herman |
| 8,344,417 B2 | 1/2013 | Weeks |
| 8,592,862 B2 | 11/2013 | Weeks |
| 8,659,030 B2 | 2/2014 | Briere |
| 8,928,003 B2 * | 1/2015 | Ueno et al. .................... 257/76 |

(Continued)

FOREIGN PATENT DOCUMENTS

| | | |
|---|---|---|
| JP | 2011-228398 JP | 11/2011 |
| JP | 2011-243978 JP | 12/2011 |
| JP | 2013-69785 JP | 4/2013 |

*Primary Examiner* — Thinh T Nguyen
(74) *Attorney, Agent, or Firm* — Farjami & Farjami LLP (57) ABSTRACT

There are disclosed herein various implementations of a group III-V merged cascode transistor. Such a group III-V merged cascode transistor includes a group III-V body disposed over a substrate and configured to produce a two-dimensional electron gas (2DEG). The group III-V body includes a group III-V barrier layer situated over a group III-V channel layer, and a source electrode and a drain electrode. The group III-V merged cascode transistor also includes an enable gate disposed in a recess extending substantially through the group III-V barrier layer, and an operational gate disposed over the group III-V barrier layer, the operational gate not being in physical contact with the enable gate.

12 Claims, 5 Drawing Sheets

(56) References Cited

U.S. PATENT DOCUMENTS

| | | |
|---|---|---|
| 9,082,691 B2 * | 7/2015 | Yoshioka et al. |
| 2007/0056506 A1 | 3/2007 | Bridger |
| 2007/0241368 A1 * | 10/2007 | Mil'shtein et al. ............ 257/192 |
| 2012/0153351 A1 | 6/2012 | Chandolu |
| 2012/0223365 A1 | 9/2012 | Briere |
| 2013/0069117 A1 * | 3/2013 | Yoshioka et al. ............. 257/194 |
| 2013/0292699 A1 * | 11/2013 | Ueno et al. ...................... 257/76 |

* cited by examiner

DUAL-GATED GROUP III-V MERGED TRANSISTOR

The present application claims the benefit of and priority to a provisional application entitled "Dual Gated Merged Cascode Device," Ser. No. 61/913,156 filed on Dec. 6, 2013. The disclosure in this provisional application is hereby incorporated fully by reference into the present application.

BACKGROUND

I. Definition

As used herein, the phrase "group III-V" refers to a compound semiconductor including at least one group III element and at least one group V element. By way of example, a group III-V semiconductor may take the form of a III-Nitride semiconductor. "III-Nitride" or "III-N" refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-N also refers generally to any polarity including but not limited to Ga-polar, N-polar, semi-polar, or non-polar crystal orientations. A III-N material may also include either the Wurtzitic, Zincblende, or mixed polytypes, and may include single-crystal, monocrystalline, polycrystalline, or amorphous structures. Gallium nitride or GaN, as used herein, refers to a III-N compound semiconductor wherein the group III element or elements include some or a substantial amount of gallium, but may also include other group III elements in addition to gallium.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as single-crystal or polycrystalline SiC on silicon, silicon on insulator (SOI), separation by implantation of oxygen (SIMOX) process substrates, and silicon on sapphire (SOS), for example.

It is noted that, as used herein, the terms "low voltage" or "LV" in reference to a transistor or switch describes a transistor or switch with a voltage range of up to approximately fifty volts (50V). It is further noted that use of the term "midvoltage" or "MV" refers to a voltage range from approximately fifty volts to approximately two hundred volts (approximately 50V to 200V). Moreover, the term "high voltage" or "HV," as used herein, refers to a voltage range from approximately two hundred volts to approximately twelve hundred volts (approximately 200V to 1200V), or higher.

II. Background Art

Group III-V based semiconductor devices, such as III-Nitride transistors, are devices that can operate using polarization fields to generate a two-dimensional electron gas (2DEG) allowing for high current densities with low resistive losses. As a result, III-Nitride and other group III-V semiconductor devices, such as depletion mode (i.e., normally on) power field-effect transistors (FETs), high electron mobility transistors (HEMTs), and diodes, are used in many power applications.

In power management applications where normally off characteristics of power devices are desirable, a depletion mode (normally on) group III-V transistor having desirable on-state characteristics, such as a low on-resistance, can be implemented in combination with an enhancement mode (normally off) group III-V transistor to produce an enhancement mode merged transistor. However, conventional approaches for implementing such merged transistors typically result in one of the depletion mode or the enhancement mode group III-V devices being susceptible to voltage breakdown due to "spillover" of the 2DEG and the possible trapping of electrons at an interface of the affected device.

SUMMARY

The present disclosure is directed to a dual-gated group III-V merged transistor, substantially as shown in and/or described in connection with at least one of the figures, and as set forth more completely in the claims.

DETAILED DESCRIPTION

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
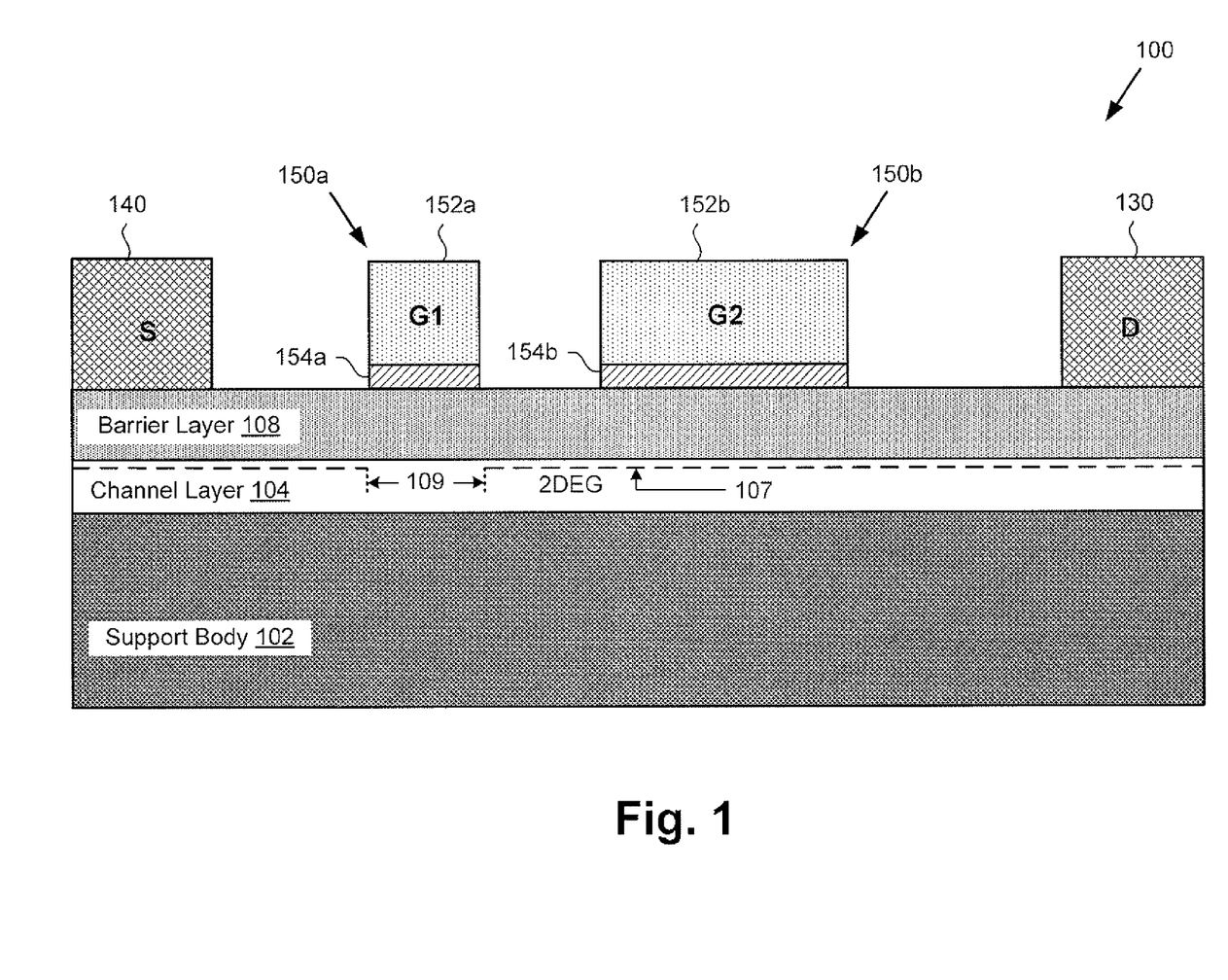
FIG. 1 shows a cross-sectional view of a dual gated merged transistor according to a conventional implementation.

FIG. 1 shows a cross-sectional view of a dual gated merged III-Nitride transistor according to a conventional implementation. Dual gated merged transistor 100 includes support body 102, channel layer 104, barrier layer 108 overlying channel layer 104, drain electrode 130, source electrode 140, first gate 150a, and second gate 150b. As shown in FIG. 1, first and second gates 150a and 150b include respective first and second gate electrodes 152a and 152b situated over respective gate dielectrics 154a and 154b.

As further shown in FIG. 1, dual gated merged transistor 100 can be configured as an enhancement mode (normally off) high electron mobility transistor (HEMT) such that in the absence of an applied voltage to first gate 150a, two-dimensional electron gas (2DEG) 106 has interrupted region 109 under first gate 150*a*. Interrupted region 109 may be produced as the result of negative ion (e.g., fluorine) implantation, by use of a P type gate region in interrupted region 109 under first gate 150*a*, by use of a floating metal gate structure as first gate 150*a*, or by other means known in the art. An example implementation of such a dual gated merged transistor is disclosed in U.S. Pat. No. 8,264,003, entitled "Merged Cascode Transistor", filed on Mar. 20, 2007, and issued on Sep. 11, 2012. This patent is hereby incorporated fully by reference into the present application.

As noted above, conventional approaches for implementing merged transistors, such as dual gated merged transistor 100, typically result in one of the depletion mode or the enhancement mode devices being susceptible to voltage breakdown. For example, when gate voltages are applied such that the applied field across barrier layer 108 exceeds a built-in barrier potential, 2DEG 107 can spill over the barrier confinement region, collapsing the field across barrier layer 108. Because the built in barrier potential for III-Nitride based devices, for example, is typically in a range from approximately 1.0 eV to approximately 2.0 eV, this spillover can occur for applied gate voltages that are positive with respect to 2DEG 107 by less than approximately +6 V to +10 V, even for insulated gate or P-N gated HEMT structures. For instance, in the conventional implementation shown in FIG. 1, first gate 150*a* suffers from this susceptibility and may be subject to breakdown due to spillover of 2DEG 107 and the possible surface trapping of electrons in barrier layer 108.

In an alternative conventional approaches for implementing merged transistors (not shown in FIG. 1) an enhancement mode metal-oxide-semiconductor field-effect transistor (MOSFET) is merged with a depletion mode HEMT. The MOSFET gate (corresponding to first gate 150*a*) is formed as a recessed gate so as to interrupt the 2DEG under the MOSFET gate. The MOSFET gate and the HEMT gate (HEMT gate corresponding to second gate 150*b*) are formed such that they are physically or electrically connected to each other. Although this alternative approach can protect the MOSFET, it has the significant disadvantage that the same applied voltage used to turn on the normally off MOSFET may result in spillover of the 2DEG, possible surface trapping of electrons in the barrier layer, and breakdown of the HEMT gate.

The present application is directed to group III-V merged cascode transistors that avoid the disadvantages associated with conventional implementations discussed above. According to various implementations of the present inventive concepts, a shorter gated (i.e. having a shorter channel length) group III-V enable transistor is cascoded with a longer gated (i.e. having a longer channel length) group III-V operational transistor to significantly optimize performance of the merged cascode transistor. In one implementation, such a group III-V merged cascode transistor includes a group III-V body including a group III-V channel layer and a group III-V barrier layer situated over the group III-V channel layer. The enable transistor includes an enable gate disposed in a recess extending through the group III-V barrier layer. The operational transistor includes an operational gate disposed over the group III-V barrier layer, the operational gate not being in physical contact with the enable gate. By configuring the enable gate to extend through the group III-V barrier layer, rather than relying on the effectiveness of an enhancement mode region, such as enhancement mode interrupted region 109 under first gate 150*a* in FIG. 1, the present inventive concepts provide a more stable and robust merged transistor.

Figure 2:
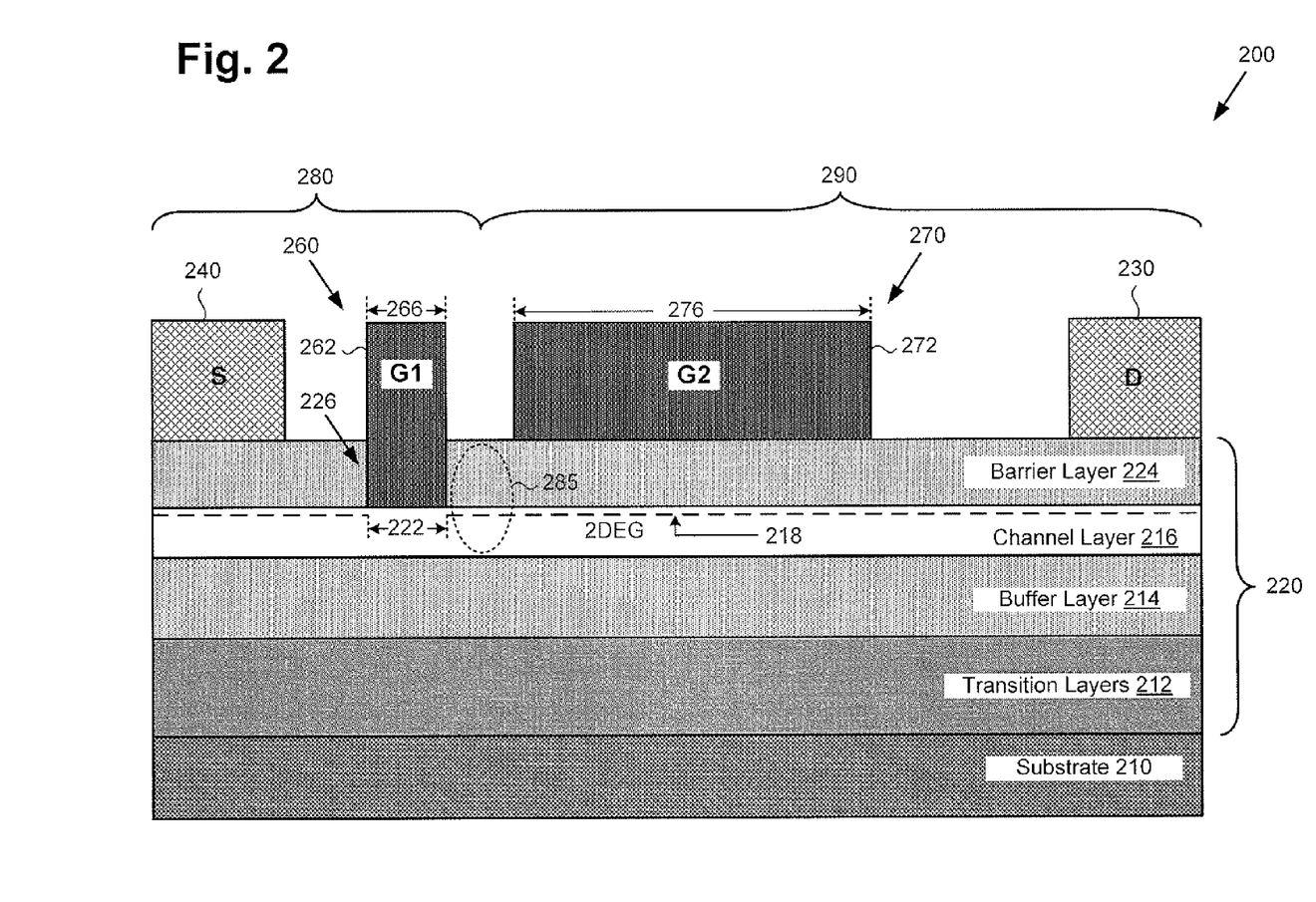
FIG. 2 shows a cross-sectional view of an exemplary group III-V merged cascode transistor, according to one implementation.

Referring to FIG. 2, FIG. 2 shows a cross-sectional view of exemplary group III-V merged cascode transistor 200, according to one implementation. As shown in FIG. 2, merged cascode transistor 200 includes group III-V body 220 disposed over substrate 210 and is configured to produce 2DEG 218. As further shown in FIG. 2, group III-V body 220 includes group III-V transition layers 212, group III-V buffer layer 214 situated over group III-V transition layers 212, group III-V channel layer 216, and group III-V barrier layer 224.

Merged cascode transistor 200 also includes drain electrode 230 and source electrode 240, as well as enable gate 260 having enable gate electrode 262 and gate length 266, and operational gate 270 having operational gate electrode 272 and gate length 276. It is noted that enable gate 260 and operational gate 270 are situated between drain electrode 230 and source electrode 240. Also shown in FIG. 2 are enable transistor 280 and operational transistor 290 of merged cascode transistor 200, merged drain/source region 285, recess 226 extending substantially through group III-V barrier layer 224, and 2DEG interrupted region 222 under recess 226 and enable gate 260.

According to the implementation shown in FIG. 2, enable transistor 280 is an enhancement mode (normally off) transistor, while operational transistor 290 is a depletion mode (normally on) transistor. As shown in FIG. 2, enable transistor 280 and operational transistor 290 are monolithically integrated in group III-V body 220, and are cascoded so as to share merged drain/source region 285 between enable gate 260 and operational gate 270 in common. In other words, merged drain/source region 285 provides a drain region for enable transistor 280 and a source region for operational transistor 290. It is noted that source electrode 240 serves as the source electrode of enable transistor 280 as well as serving as the source electrode for merged cascode transistor 200. It is further noted that drain electrode 240 serves as the drain electrode of operational transistor 280 as well as serving as the drain electrode for merged cascode transistor 200. Drain electrode 230 and source electrode 240 are configured such that they make ohmic contact with 2DEG 218.

Substrate 210 may be formed of any commonly utilized substrate material. For example, substrate 210 may be formed of sapphire, may be a native group III-V substrate, or may be a group IV substrate as described above in the "Definitions" section. In implementations in which substrate 210 is a native group III-V substrate, group III-V transition layers 212 and/or group III-V buffer layer 214 may be omitted. However, when present, group III-V transition layers 212 may include multiple group III-V layers.

It is noted that, in general, transition layers 212 may include an aluminum nitride (AlN) layer formed on substrate 210, or on a stress reducing layer and/or a nucleation layer formed on substrate 210, and may further include a series of AlGaN layers having a progressively reduced aluminum content relative to their gallium content, until a suitable transition to buffer layer 214 and/or channel layer 216 is achieved. Moreover, in some implementations, transition layers 212 may take the form of a compositionally graded body having different group III-V alloy compositions at respective top and bottom surfaces.

Examples of using compositionally graded transition layers, as well as use of intermediate layers, stress reducing layers, and various interlayers are disclosed in U.S. Pat. No. 6,649,287, entitled "Gallium Nitride Materials and Methods", filed on Dec. 14, 2000, and issued on Nov. 18, 2003; U.S. Pat. No. 6,617,060, also entitled "Gallium Nitride Materials and Methods", filed on Jul. 2, 2002, and issued on Sep. 9, 2003; U.S. Pat. No. 7,339,205, entitled "Gallium Nitride Materials and Methods Associated with the Same", filed on Jun. 28, 2004, and issued on Mar. 4, 2008; U.S. Pat. No. 8,344,417, entitled "Gallium Nitride Semiconductor Structures with Compositionally-Graded Transition Layer", filed on Jan. 27, 2012, and issued on Jan. 1, 2013; U.S. Pat. No. 8,592,862, also entitled "Gallium Nitride Semiconductor Structures with Compositionally-Graded Transition Layer", filed on Dec. 27, 2012, and issued on Nov. 26, 2013; U.S. patent application Ser. No. 12/928,946, entitled "Stress Modulated Group III-V Semiconductor Device and Related Method", filed on Dec. 21, 2010, and published as U.S. Patent Application Publication Number 2012/0153351 on Jun. 21, 2012; U.S. patent application Ser. No. 11/531,508, entitled "Process for Manufacture of Super Lattice Using Alternating High and Low Temperature Layers to Block Parasitic Current Path", filed on Sep. 13, 2006, and published as U.S. Patent Application Publication Number 2007/0056506 on Mar. 15, 2007; and U.S. patent application Ser. No. 13/405,180, entitled "III-Nitride Semiconductor Structures with Strain Absorbing Interlayer Transition Modules", filed on Feb. 24, 2012 and published as U.S. Patent Application Publication Number 2012/0223365 on Sep. 6, 2012. The disclosures in above-referenced patents and patent applications are hereby incorporated fully by reference into the present application. Moreover, the discussion herein regarding transition layers 212 applies to transition layers in various implementations of the present disclosure, such as those discussed in relation to FIGS. 3, 4, and 5 below.

Although not shown in FIG. 2, in some implementations, merged cascode transistor 200 may also include a strain-absorbing layer formed between substrate 210 and group III-V transition layers 212. Such a strain-absorbing layer may be an amorphous strain-absorbing layer, for example, an amorphous silicon nitride layer. It is noted that in implementations in which substrate 210 is a non-native substrate for group III-V body 220 (i.e., a non group III-V substrate, such as a silicon or other group IV substrate), group III-V transition layers 212 are provided to mediate the lattice transition from substrate 210 to group III-V buffer layer 214.

In one implementation, group III-V transition layers 212 may include a nucleation layer (nucleation layer not shown in FIG. 2), in addition to layers formed so as to reduce the net mismatch in thermal coefficient of expansion between substrate 210 and later formed group III-V active layers, such as group III-V buffer layer 214, group III-V channel layer 216 and group III-V barrier layer 224. For instance, when forming a gallium nitride (GaN) based merged cascode transistor, group III-V transition layers 212 may include an aluminum nitride (AlN) layer formed on substrate 210, or on a stress reducing layer and/or a nucleation layer formed on substrate 210, and may further include a series of intermediate layers, such as AlGaN layers having a progressively reduced aluminum content relative to their gallium content, until a suitable transition to a GaN buffer layer 214 is achieved.

In some implementations, group III-V transition layers 212 may include compositionally graded III-Nitride or other group III-V materials. In such implementations, the specific compositions and thicknesses of group III-V transition layers 212 may depend on the diameter and thickness of substrate 210, and the desired performance of merged cascode transistor 200. For example, the desired breakdown voltage of merged cascode transistor 200, as well as the desired bow and warp of the associated epitaxial wafer supporting fabrication of merged cascode transistor 200 can influence the compositions and thicknesses of group III-V transition layers 212, as known in the art.

Group III-V buffer layer 214 is situated over group III-V transition layers 212 and may be formed using any of a number of known growth techniques. For example, in implementations in which merged cascode transistor 200 is a GaN based transistor, buffer layer 214 may be an intrinsic GaN layer, or may be a compositionally graded GaN based layer. Group III-V buffer layer 214 may be formed using any suitable technique for forming III-Nitride or other group III-V based layers, such as molecular-beam epitaxy (MBE), metalorganic chemical vapor deposition (MOCVD), or hydride vapor phase epitaxy (HVPE), to name a few suitable approaches. It is noted that any of MBE, MOCVD, or HVPE, for example, may also be used to form group III-V transition layers 212, group III-V channel layer 216, and group III-V barrier layer 224.

As shown in FIG. 2, group III-V channel layer 216 is formed over group III-V buffer layer 214, and group III-V barrier layer 224 is formed over group III-V channel layer 216. In addition a thin group III-V capping layer may be used over group III-V barrier layer 224 (capping layer not shown). In one implementation, for example, merged cascode transistor 200 may take the form of a III-Nitride HEMT having a gallium nitride (GaN) layer as group III-V channel layer 216 and an aluminum gallium nitride (AlGaN) layer as group III-V barrier layer 224. It is noted that, in some implementations, the optional capping layer described above may be formed of GaN or AlGaN and may be intentionally doped or may be substantially undoped. However, in other implementations, the optional capping layer may be formed of an insulating material, such as silicon nitride ($Si_3N_4$), for example.

It is further noted that in certain applications, it may be desirable to form group III-V barrier layer 224 over a spacer layer (or layers) disposed between group III-V barrier layer 224 and group III-V channel layer 216. Examples of using such spacer layer(s) are disclosed in U.S. Pat. No. 8,659,030, entitled "II-Nitride Heterojunction Devices Having a Multilayer Spacer", filed on Feb. 15, 2012, and issued on Feb. 25, 2014. This patent is hereby incorporated fully by reference into the present application.

Merged cascode transistor 200 includes enable gate 260 disposed in recess 226 extending substantially through group III-V barrier layer 224, while operational gate 270 is disposed over group III-V barrier layer 224. As shown in FIG. 2, in one implementation, enable gate 260 extends through the entirety of group III-V barrier layer 224 to make contact with group III-V channel layer 216. As a result, the heterostructure giving rise to 2DEG 218 is substantially eliminated under enable gate 260, resulting in a surface inversion device structure under enable gate 260 and thereby providing a more stable merged device compared to conventional implementations.

It is noted that in some implementations, recess 226 may not extend through the entirety of group III-V barrier 224. For instance, in one implementation, recess 226 may terminate within group III-V barrier layer 224 at some height above group III-V channel layer 216, such as a height of approximately five nanometers (5.0 nm) or less, for example. Alternatively, in some implementations, recess 226 may extend through group III-V barrier layer 224 and into group III-V channel layer 216 so as to terminate within group III-V channel layer 216.

As noted above, in conventional merged gate transistors, when gate voltages are applied such that the applied field across the barrier layer exceeds the built-in barrier potential, the 2DEG can spill over the barrier confinement region, collapsing the field across the barrier layer. As further noted above, because the built in barrier potential for III-Nitride based devices, for example, is typically in a range from approximately 1.0 eV to approximately 2.0 eV, this spillover can occur for applied gate voltages that are positive with respect to the 2DEG by less than approximately +6 V to +10 V, even for insulated gate or P-N gated HEMT structures. However, by using a surface inversion device structure under enable gate 260, i.e., by removing group III-V barrier layer 224 and hence producing 2DEG interrupted region 222, the maximum gate voltage can advantageously be increased to +10 V, +15 V, or higher, without significant risk of failure by merged cascode transistor 200, especially when enable gate 260 is implemented as an insulated gate, as shown and described below by reference to FIG. 3 and FIG. 5.

According to the implementation shown in FIG. 2, enable gate 260 may be implemented as a Schottky gate including Schottky enable gate electrode 262. In one implementation, as shown in FIG. 2, enable gate electrode 262 of Schottky enable gate 260 may be in contact, i.e., Schottky contact, with group III-V channel layer 216. As further shown in FIG. 2, in some implementations, operational gate 270 may be a Schottky gate including Schottky operational gate electrode 272 making Schottky contact with group III-V barrier layer 224. It is noted that operational gate 270 is not in physical contact with enable gate 260. Furthermore, operational gate 270 and enable gate 260 may be independently controlled by being coupled to respective independent gate voltages. For example, in some implementations, operational gate 270 may be tied to ground, or may be electrically connected to source electrode 240, while enable gate 260 is independently controlled by an external input voltage. However, implementation of a Schottky gate as enable gate 260 can result in higher device leakage current when compared to implementations in which enable gate 260 takes the form of an insulated gate. Consequently, implementation of enable gate 260 as an insulted gate can be advantageous.

As shown in FIG. 2, the presence of 2DEG interrupted region 222 under enable gate 260 results in merged cascode transistor 200 being operable as an enhancement mode (normally off) transistor. Moreover, the integrated cascode connection of enhancement mode enable transistor 280 with depletion mode operational transistor 290 enables use of relatively short gated enable transistor 280 to control significantly longer gated (and higher standoff voltage capable) operational transistor 290. This is due to the fact that when enable transistor 280 is off and a voltage is applied to drain electrode 230 which is positive with respect to source electrode 240, operational transistor 290 is forced to deplete 2DEG 218.

Thus, because enhancement mode enable transistor 280 will typically not have a high voltage across its channel and drift regions, enhancement mode enable transistor 280 can be optimized for low voltage (LV) operation, which may include having very short gate length 266. For example, gate length 266 may be on the order of approximately 0.3 μm or less, and may be very much shorter than gate length 276, which may be on the order of approximately 2.0 μm or longer. This may be advantageous because the on-state characteristics of an enhancement mode device, such as enable transistor 280, is typically significantly worse than those of a comparably sized depletion mode device. As an added benefit, short gate length 266 results in reduced gate charge and gate capacitance for enable gate 260, thereby improving the switching performance of merged cascode transistor 200. Consequently, the implementation shown in FIG. 2 can significantly optimize the performance of merged cascode transistor 200 concurrently in terms of breakdown voltage (or reverse withstand voltage), switching gate capacitance, and on-state resistance. Moreover, in order to improve performance of merged cascode transistor 200, the length of merged drain/source region 285 should be less than or substantially less than gate length 276 of operational gate 270. Further, the length of merged drain/source region 285 should also be preferably less than or equal to gate length 266 of enable gate 260.

It is noted that operational gate 270 may include many features (not shown in FIG. 2) but utilized with high voltage (HV) gate structures, including the use of a field plate or stepped field plates which may be physically connected and/or electrically connected to operational gate 270. Such a field plate construction may include a resistive layer, which could be constructed from amorphous or polycrystalline III-Nitride material (such as AlGaN, GaN, or AlN) meant to more evenly distribute the electric field between operational gate 270 and drain electrode 230.

Figure 3:
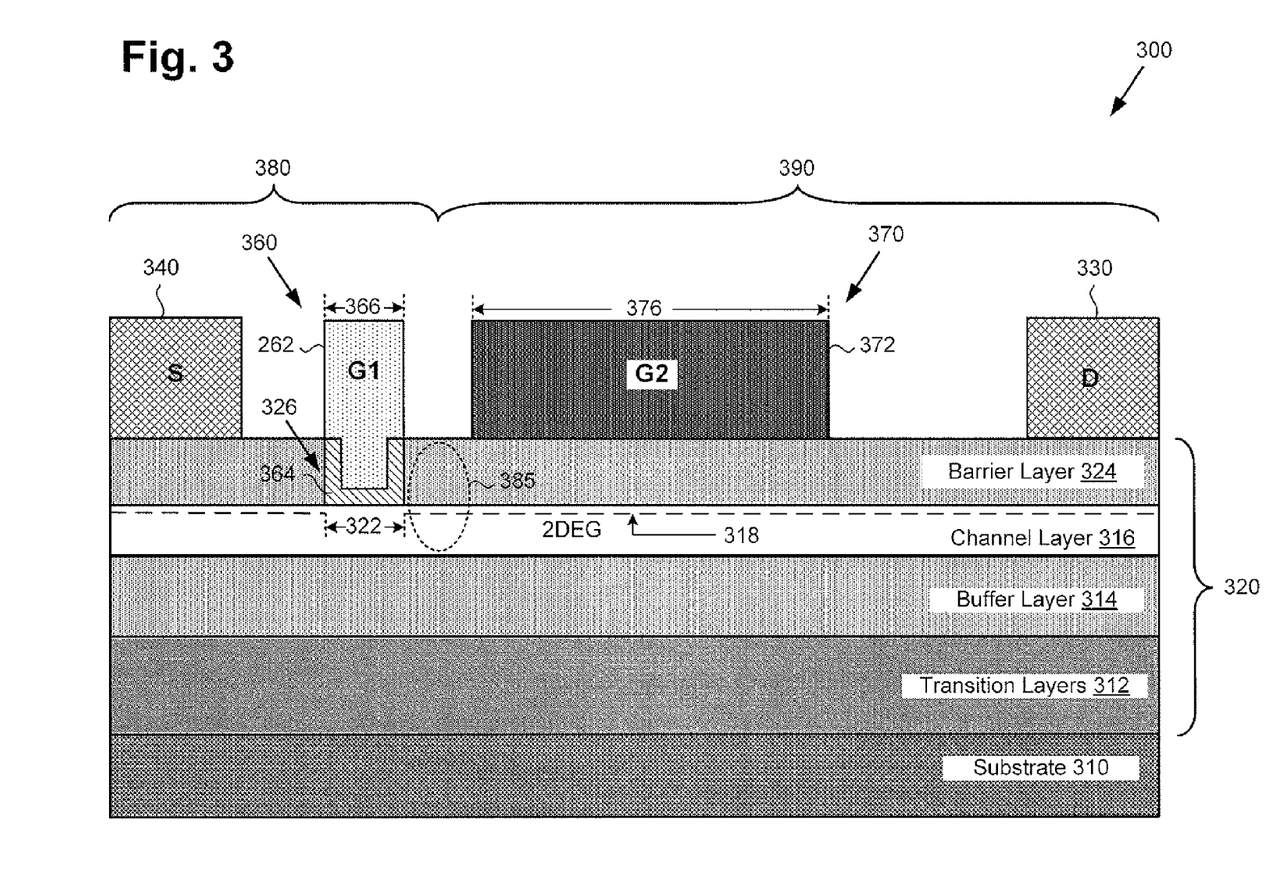
FIG. 3 shows a cross-sectional view of an exemplary group III-V merged cascode transistor, according to another implementation.

Continuing to FIG. 3, FIG. 3 shows a cross-sectional view of exemplary group III-V merged cascode transistor 300, according to another implementation. As shown in FIG. 3, merged cascode transistor 300 includes group III-V body 320 disposed over substrate 310 and configured to produce 2DEG 318. As further shown in FIG. 3, group III-V body 320 includes group III-V transition layers 312, group III-V buffer layer 314 situated over group III-V transition layers 312, group III-V channel layer 316, and group III-V barrier layer 324.

Merged cascode transistor 300 also includes drain electrode 330 and source electrode 340 situated over group III-V barrier layer 324, as well as enable gate 360 having enable gate electrode 362 and gate length 366, and operational gate 370 having operational gate electrode 372 and gate length 376. It is noted that enable gate 360 and operational gate 370 are situated between drain electrode 330 and source electrode 340. Also shown in FIG. 3 are enable transistor 380 and operational transistor 390 of merged cascode transistor 300, merged drain/source region 385, recess 326 extending substantially through group III-V barrier layer 324, 2DEG interrupted region 322 under recess 326 and enable gate 360, and enable gate dielectric 364 in recess 326.

Merged cascode transistor 300 including enhancement mode enable transistor 380 monolithically integrated with depletion mode operational transistor 390 in group III-V body 320 corresponds in general to merged cascode transistor 200 including enable transistor 280 monolithically integrated with operational transistor 290 in group III-V body 220, in FIG. 2. As a result, enable transistor 380, operational transistor 390, group III-V body 320, substrate 310, drain electrode 330, source electrode 340, recess 326, and operational gate 370 having operational gate electrode 372 and gate length 376 can share any of the characteristics attributed to their corresponding features, above.

In addition, it is noted that gate length 366 of enable gate 360, in FIG. 3, may correspond to gate length 266 of enable gate 260, in FIG. 2, and described above. However, in contrast to the implementation shown in FIG. 2, enable gate 360, in FIG. 3, is implemented as an insulated gate including enable gate dielectric 364 situated in recess 326 between enable gate electrode 362 and group III-V channel layer 316. Thus, according to the implementation shown in FIG. 3, enable gate 360 may take the form of a MOSFET gate, or, more generally, a metal-insulator-semiconductor FET (MISFET) gate having enable gate electrode 362 situated over enable gate dielectric 364. Enable gate electrode 362 may be implemented as a conductive polysilicon gate electrode, or as a metal gate electrode, for example. Enable gate dielectric 364 may be formed of any suitable gate dielectric material, such as silicon oxide ($SiO_2$), AlN, aluminum oxide ($Al_2O_3$) or gadolinium gallate ($GdGaO_3$), for example, and may be disposed in recess 326 so as to make contact with group III-V channel layer 316. In some implementations, it may be advantageous to implement enable gate dielectric 364 as a silicon nitride gate dielectric.

Moreover, as with the implementation shown in FIG. 2, in order to improve performance of merged cascode transistor 300, the length of merged drain/source region 385 should be less than or substantially less than gate length 376 of operational gate 370. Further, the length of merged drain/source region 385 should also be preferably less than or equal to gate length 366 of enable gate 360.

Figure 4:
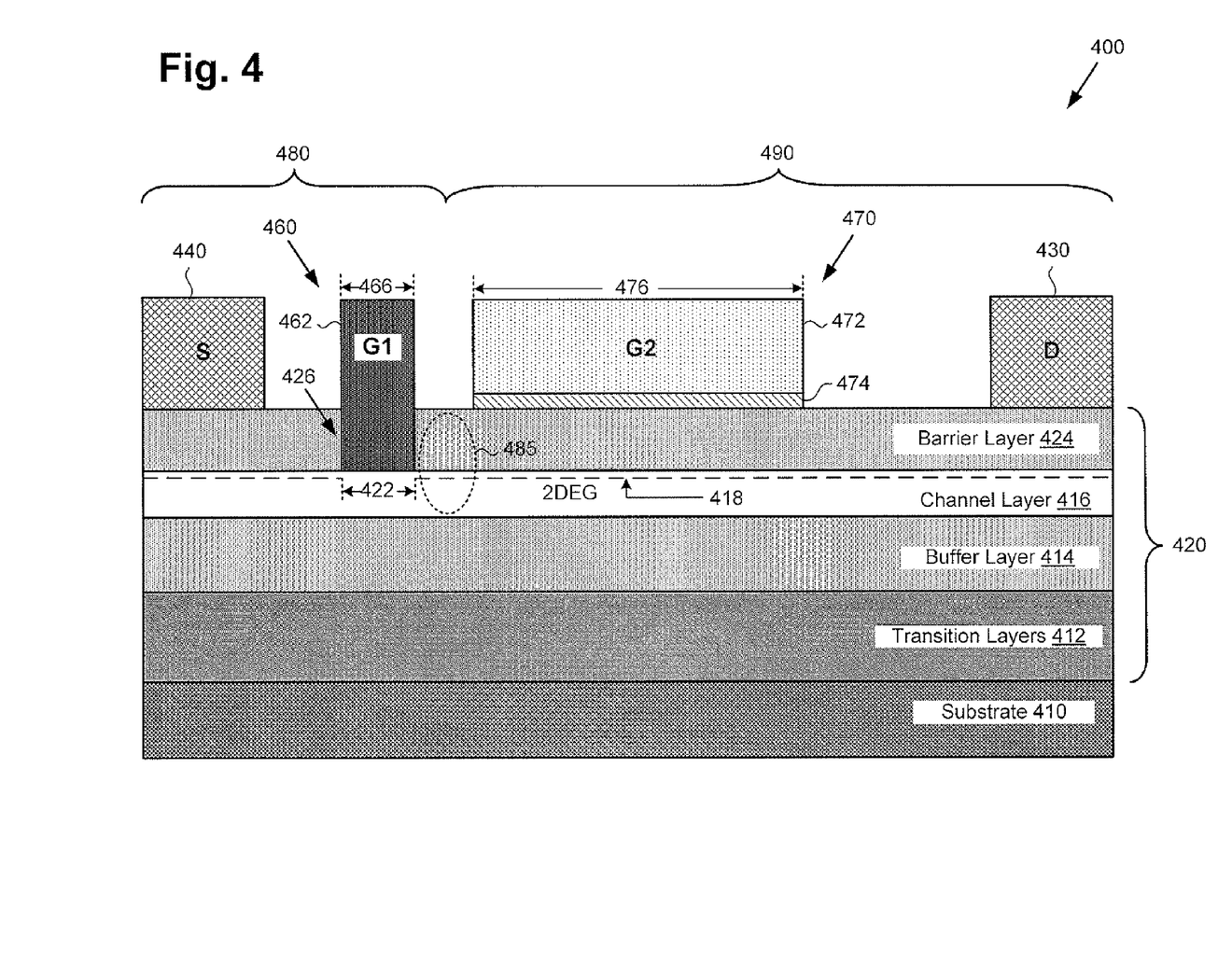
FIG. 4 shows a cross-sectional view of an exemplary group III-V merged cascode transistor, according to yet another implementation.

Referring to FIG. 4, FIG. 4 shows a cross-sectional view of exemplary group III-V merged cascode transistor 400, according to yet another implementation. As shown in FIG. 4, merged cascode transistor 400 includes group III-V body 420 disposed over substrate 410 and configured to produce 2DEG 418. As further shown in FIG. 3, group III-V body 420 includes group III-V transition layers 412, group III-V buffer layer 414 situated over group III-V transition layers 412, group III-V channel layer 416, and group III-V barrier layer 424.

Merged cascode transistor 400 also includes drain electrode 430 and source electrode 440 situated over group III-V barrier layer 424, as well as enable gate 460 having enable gate electrode 462 and gate length 466, and operational gate 470 having operational gate electrode 472 and gate length 476. It is noted that enable gate 460 and operational gate 470 are situated between drain electrode 430 and source electrode 440. Also shown in FIG. 4 are enable transistor 480 and operational transistor 490 of merged cascode transistor 400, merged drain/source region 485, recess 426 extending substantially through group III-V barrier layer 424, 2DEG interrupted region 422 under recess 426 and enable gate 460, and operational gate dielectric 474.

Merged cascode transistor 400 including enhancement mode enable transistor 480 monolithically integrated with depletion mode operational transistor 490 in group III-V body 420 corresponds in general to merged cascode transistor 200 including enable transistor 280 monolithically integrated with operational transistor 290 in group III-V body 220, in FIG. 2. As a result, enable transistor 480, operational transistor 490, group III-V body 420, substrate 410, drain electrode 430, source electrode 440, recess 426, and enable gate 460 having enable gate electrode 462 and gate length 466 can share any of the characteristics attributed to their corresponding features, above.

In addition, it is noted that gate length 476 of operational gate 470, in FIG. 4, may correspond to gate length 276 of operational gate 270, in FIG. 2, and described above. However, in contrast to the implementation shown in FIG. 2, operational gate 470, in FIG. 4, is implemented as an insulated gate in which operational gate electrode 472 is situated over operational gate dielectric 474, which in turn is situated over group III-V barrier layer 424. Operational gate electrode 472 may be implemented as a conductive polysilicon gate electrode, or as a metal gate electrode, for example. Operational gate dielectric 474 may be formed of any suitable gate dielectric material, such as silicon oxide, AlN, $Al_2O_3$, or $GdGaO_3$, for example. In some implementations, it may be advantageous to implement operational gate dielectric 474 as a silicon nitride gate dielectric. Moreover, as with the implementation shown in FIGS. 2 and 3, in order to improve performance of merged cascode transistor 400, the length of merged drain/source region 485 should be less than or substantially less than gate length 476 of operational gate 470. Further, the length of merged drain/source region 485 should also be preferably less than or equal to gate length 466 of enable gate 460.

Figure 5:
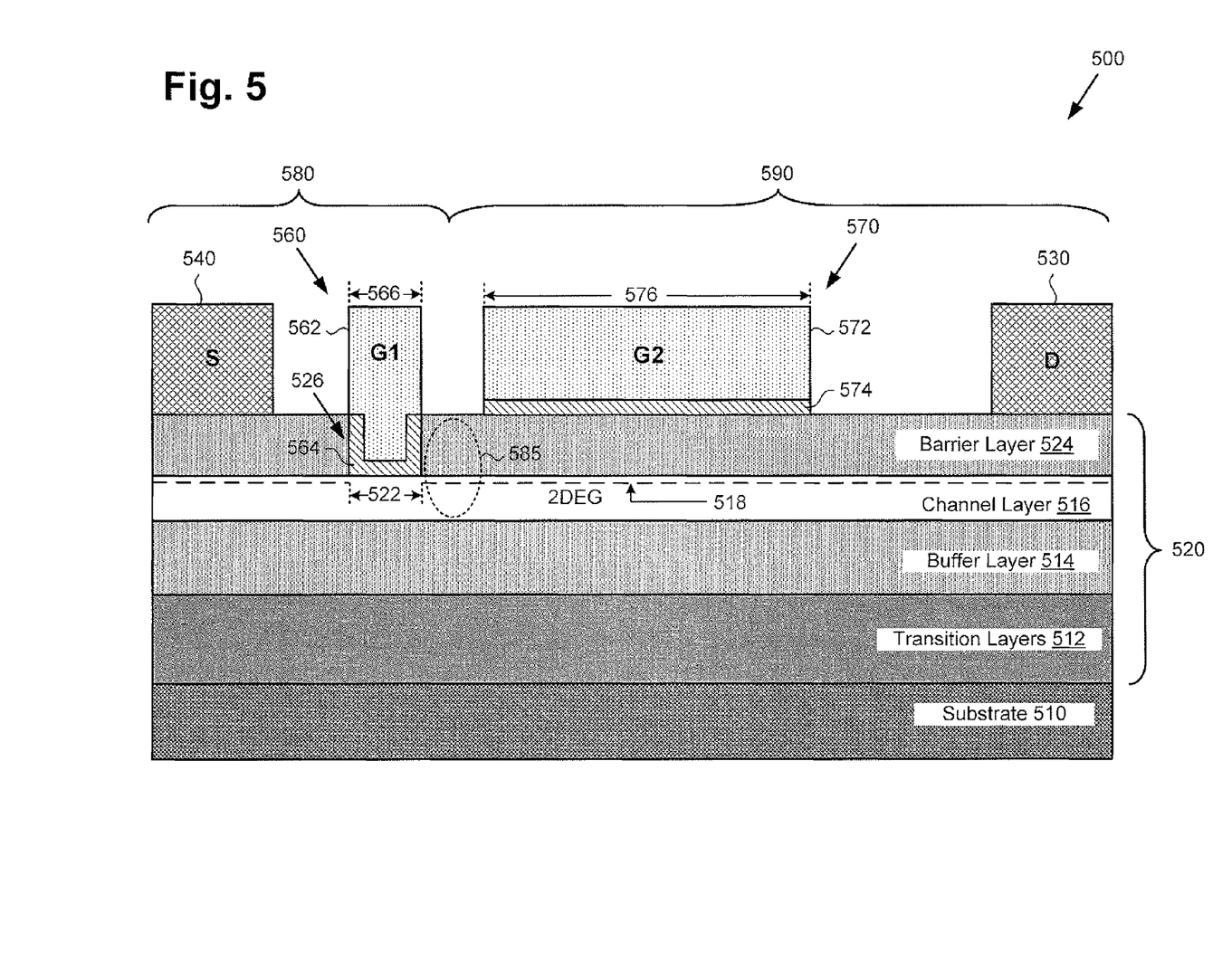
FIG. 5 shows a cross-sectional view of an exemplary group III-V merged cascode transistor, according to another implementation.

Turning to FIG. 5, FIG. 5 shows a cross-sectional view of exemplary group III-V merged cascode transistor 500, according to another implementation. As shown in FIG. 5, merged cascode transistor 500 includes group III-V body 520 disposed over substrate 510 and configured to produce 2DEG 518. As further shown in FIG. 5, group III-V body 520 includes group III-V transition layers 512, group III-V buffer layer 514 situated over group III-V transition layers 512, group III-V channel layer 516, and group III-V barrier layer 524.

Merged cascode transistor 500 also includes drain electrode 530 and source electrode 540 situated over group III-V barrier layer 524, as well as enable gate 560 having enable gate electrode 562 and gate length 566, and operational gate 570 having operational gate electrode 572 and gate length 576. It is noted that enable gate 560 and operational gate 570 are situated between drain electrode 530 and source electrode 540. Also shown in FIG. 5 are enable transistor 580 and operational transistor 590 of merged cascode transistor 500, merged drain/source region 585, recess 526 extending substantially through group III-V barrier layer 524, 2DEG interrupted region 522 under recess 526 and enable gate 560, operational gate dielectric 574, and enable gate dielectric 564 in recess 526.

Merged cascode transistor 500 including enhancement mode enable transistor 580 monolithically integrated with depletion mode operational transistor 590 in group III-V body 520 corresponds in general to merged cascode transistor 200 including enable transistor 280 monolithically integrated with operational transistor 290 in group III-V body 220, in FIG. 2. As a result, enable transistor 580, operational transistor 590, group III-V body 520, substrate 510, drain electrode 530, source electrode 540, and recess 526 can share any of the characteristics attributed to their corresponding features, above.

In addition, it is noted that gate lengths 566 and 576 of respective enable gate 560 and operational gate 570, in FIG. 5, correspond respectively to gate lengths 266 and 276, in FIG. 2, as described above. However, in contrast to the implementation shown in FIG. 2, enable gate 560 and operational gate 570, in FIG. 5, are implemented as insulated gates.

As shown in FIG. 5, enable gate 560 includes enable gate dielectric 564 situated in recess 526 between enable gate electrode 562 and group III-V channel layer 516. Thus, according to the implementation shown in FIG. 5, enable gate 560 may take the form of a MOSFET gate, or, more generally, a MISFET gate having enable gate electrode 562 situated over enable gate dielectric 564. Moreover, operational gate 570 includes operational gate electrode 572 situated over operational gate dielectric 574, which in turn is situated over group III-V barrier layer 524. Enable gate electrode 562 and operational gate electrode 572 may be implemented as a conductive polysilicon gate electrodes, or as a metal gate electrodes, for example. Enable gate dielectric 564 and operational gate dielectric 574 may be formed of any suitable gate dielectric material, such as silicon oxide, AlN, $Al_2O_3$, or $GdGaO_3$, for example. In some implementations, it may be advantageous to implement one or both of enable gate dielectric 564 and operational gate dielectric 574 as a silicon nitride gate dielectric. Moreover, as with the implementation shown in FIGS. 2, 3 and 4, in order to improve performance of merged cascode transistor 500, the length of merged drain/source region 585 should be less than or substantially less than gate length 576 of operational gate 570. Further, the length of merged drain/source region 585 should also be preferably less than or equal to gate length 566 of enable gate 560.

Thus, the present application discloses a group III-V merged cascode transistor. According to various implementations of the present inventive concepts a shorter gated group III-V enable transistor is cascoded with a longer gated group III-V operational transistor to significantly optimize performance of the merged cascode transistor. Such a group III-V merged cascode transistor includes a group III-V body including a group III-V channel layer and a group III-V barrier layer situated over the group III-V channel layer. The enable transistor includes an enable gate disposed in a recess extending through the group III-V barrier layer. The operational transistor includes an operational gate disposed over the group III-V barrier layer, the operational gate not being in physical contact with the enable gate. By configuring the enable gate to extend through the group III-V barrier layer to disrupt the 2DEG conduction channel of the merged cascode transistor when the merged cascode transistor is in the off-state, the solution disclosed herein provides a more stable and robust merged transistor.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A group III-V merged cascode transistor comprising:
   a group III-V body disposed over a substrate and configured to produce a two-dimensional electron gas (2DEG), said group III-V body including a group III-V barrier layer situated over a group III-V channel layer;
   a source electrode and a drain electrode;
   an enable gate disposed in a recess extending through said group, III-V barrier layer, said enable gate including a gate electrode in direct contact with said group III-V channel layer; and
   an operational gate disposed over said group III-V barrier layer, said operational gate not being in physical contact with said enable gate.

2. The group III-V merged cascode transistor of claim 1, wherein said enable gate terminates within said group III-V channel layer.

3. The group III-V merged cascode transistor of claim 1, wherein said enable gate comprises a Schottky gate.

4. The group III-V merged cascode transistor of claim 1, wherein said operational gate makes Schottky contact with said group III-V barrier layer.

5. The group merged cascode transistor of claim 1, wherein said group III-V merged cascode transistor is an enhancement mode (normally off) transistor.

6. The group III-V merged cascode transistor of claim 1, wherein a length of a merged drain/source region of said group merged cascode transistor is less than a gate length of said operational gate.

7. The group III-V merged cascode transistor of claim 1, wherein a length of a merged drain/source region of said group III-V merged cascode transistor is less than or equal to a gate length of said enable gate.

8. A group III-V merged cascode transistor comprising:
   a group III-V body disposed over a substrate and configured to produce a two-dimensional electron gas (2DEG), said group III-V body including a group III-V barrier layer situated over a group III-V channel layer;
   a source electrode and a drain electrode;
   a Schottky enable gate disposed in a recess extending through said group III-V barrier layer, said Schottky enable gate including a gate electrode in direct contact with said group III-V channel layer;
   an operational gate disposed over said group III-V barrier layer, said operational gate not being in physical contact with said Schottky enable gate.

9. The group III-V merged cascode transistor of claim 8, wherein said operational gate makes Schottky contact with said group III-V barrier layer.

10. The group III-V merged cascode transistor of claim 8, wherein said group III-V merged cascode transistor is an enhancement mode (normally off) transistor.

11. The group III-V merged cascode transistor of claim 8, wherein a length of a merged drain/source region of said group III-V merged cascode transistor is less than a gate length of said operational gate.

12. The group III-V merged cascode transistor of claim 8, wherein a length of a merged drain/source region of said group 11I-V merged cascode transistor is less than or equal to a gate length of said Schottky enable gate.

* * * * *